US009425131B2

(12) United States Patent
Chen

(10) Patent No.: US 9,425,131 B2
(45) Date of Patent: *Aug. 23, 2016

(54) PACKAGE STRUCTURE

(71) Applicant: Delta Electronics Int'l (Singapore) Pte Ltd, Singapore (SG)

(72) Inventor: Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/230,865

(22) Filed: Mar. 31, 2014

(65) Prior Publication Data

US 2015/0255380 A1   Sep. 10, 2015

(30) Foreign Application Priority Data

Mar. 5, 2014   (SG) .......................... 10201400390Y

(51) Int. Cl.
| *H01L 23/495* | (2006.01) |
| *H01L 23/498* | (2006.01) |
| *H01L 23/13* | (2006.01) |
| *H01L 23/367* | (2006.01) |

(Continued)

(52) U.S. Cl.
CPC .......... *H01L 23/49568* (2013.01); *H01L 23/13* (2013.01); *H01L 23/367* (2013.01); *H01L 23/49575* (2013.01); *H01L 23/49827* (2013.01); *H01L 23/5383* (2013.01); *H01L 23/5389* (2013.01); *H01L 24/24* (2013.01); *H01L 24/25* (2013.01); *H01L 23/3677* (2013.01); *H01L 2224/04105* (2013.01); *H01L 2224/18* (2013.01); *H01L 2224/24137* (2013.01); *H01L 2224/24195* (2013.01); *H01L 2224/2518* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ................... H05K 2201/10598; H05K 1/0204
USPC ......... 257/675, 706, 717, 720, 734, 756, 758, 257/774
See application file for complete search history.

(56) References Cited

U.S. PATENT DOCUMENTS

| 6,628,526 B1 | 9/2003 | Oshima et al. |
| 7,572,681 B1 | 8/2009 | Huemoeller et al. |
| 7,738,256 B2 | 6/2010 | Sawatari et al. |

(Continued)

Primary Examiner — Julio J Maldonado
Assistant Examiner — Hajar Kolahdouzan
(74) Attorney, Agent, or Firm — Kirton McConkie; Evan R. Witt

(57) ABSTRACT

A package structure includes an insulation layer, a first conductive layer, a second conductive layer, at least one electronic component, and at least one thermal conduction structure. At least one first conductive via and at least one second conductive via are formed in the insulation layer. The first conductive layer is disposed on a top surface of the insulation layer and contacted with said at least one first conductive via. The second conductive layer is disposed on a bottom surface of the insulation layer and contacted with the second conductive via. The electronic component is embedded within the insulation layer, and includes plural conducting terminals. The plural conducting terminal is electrically connected with the first conductive layer and the second conductive layer through said at least one first conductive via and said at least one second conductive via. Said at least one thermal conduction structure is embedded within the insulation layer.

20 Claims, 8 Drawing Sheets

(51) Int. Cl.
*H01L 23/538* (2006.01)
*H01L 23/00* (2006.01)

(56) References Cited

U.S. PATENT DOCUMENTS

| | | |
|---|---|---|
| 7,989,944 B2 | 8/2011 | Tuominen |
| 8,026,614 B2 | 9/2011 | Kawabata et al. |
| 8,072,769 B2 | 12/2011 | Ieki et al. |
| 8,381,394 B2 | 2/2013 | Shizuno |
| 9,107,290 B1 * | 8/2015 | Chen .................... H05K 3/0061 |
| 2004/0173901 A1 * | 9/2004 | Mallik et al. .................. 257/738 |
| 2005/0212078 A1 | 9/2005 | Kwon et al. |
| 2008/0196932 A1 * | 8/2008 | Sawatari et al. .............. 174/260 |
| 2012/0319258 A1 | 12/2012 | Lu et al. |
| 2013/0027896 A1 | 1/2013 | Lee et al. |
| 2013/0032938 A1 * | 2/2013 | Lin et al. ........................ 257/737 |
| 2013/0093069 A1 | 4/2013 | Lu et al. |
| 2013/0277034 A1 * | 10/2013 | Iwata et al. ................... 165/185 |

* cited by examiner

PACKAGE STRUCTURE

FIELD OF THE INVENTION

The present invention relates to a package structure, and more particularly to a package structure with embedded thermal conduction structures capable of enhancing the heat dissipating efficiency.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, several electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a motherboard or a system circuit board.

Conventionally, the package structures of the power module are classified into three types. The first type of package structure is a single in-line package structure (SIP structure). After active components and passive components are mounted on a printed circuit board (PCB) or a substrate, a single row of leads are protruded from a side of the package structure by using a lead frame. The method of fabricating the single in-line package structure is easy by simply welding electronic components on the printed circuit board. Moreover, since the layout area of the single in-line package structure is large, the capability to withstand heat and the heat dissipating efficacy are both good. However, in addition to the active components, the traces of the printed circuit board or the substrate and safety distances between the electronic components may influence the overall area of the package structure. In other words, the area of the single in-line package structure is very large and occupies much space of the electronic device. Moreover, since all active components need to be previously packaged and the layout area is large, the overall fabricating cost is high. Moreover, since the single in-line package structure is manually installed on the system circuit board, the assembling process of the single in-line package structure is time-consuming and labor-intensive.

The second type of package structure is a land grid array (LGA) package structure. After the electronic components and the traces are installed on a printed circuit board, the electronic components and the traces are packaged by a molding process. In addition, plural contact pads are formed on a backside of the printed circuit board in order to be electrically connected with external device. In other words, the LGA package structure has a smaller layout area, a small overall volume and high density integration, and the method of fabricating the LGA package structure is simple and cost-effective. Moreover, the LGA package structure may be installed on a system circuit board by a surface mount technology. However, since the electronic components are arranged on the same layer of the printed circuit board, the traces between electronic components are still long. Under this circumstance, the line impedance is high, and a parasitic effect is easily generated. In other words, the electrical properties are possibly unsatisfied. Moreover, since the LGA package structure is only about to dissipate heat in a single direction, the heat dissipating efficiency is insufficient.

The third type of package structure is a ball grid array (BGA) package structure. Except that the signal output points of the BGA package structure are solder balls, the BGA package structure is similar to the LGA package structure. Since the BGA package structure has the solder balls, it is not necessary to print sold paste. That is, by simply printing flux, the BGA package structure may be installed on a system circuit board. In comparison with the LGA package structure, the BGA package structure is less prone to poor welding. However, since the process of forming the solder balls is complicated and expensive, the BGA package structure is not cost-effective. Moreover, the heat dissipating efficiency is still insufficient.

Therefore, there is a need of providing an improved package structure in order to eliminate the above drawbacks.

SUMMARY OF THE INVENTION

The present invention provides a package structure with at least one embedded thermal conduction structure. The heat generated from the electronic component can be transferred to the surroundings of the package structure through the low thermal resistance paths of the conductive layers and the thermal conduction structure along vertical and horizontal directions so that the heat dissipating efficiency is enhanced and the fabricating cost is reduced.

The present invention provides a package structure for packaging electronic components in high density integration by using a surface mount technology (SMT).

An aspect of the present invention provides a package structure. The package structure includes an insulation layer, a first conductive layer, a second conductive layer, at least one electronic component, and at least one thermal conduction structure. At least one first conductive via and at least one second conductive via are formed in the insulation layer. The first conductive layer is disposed on a top surface of the insulation layer and contacted with said at least one first conductive via. The second conductive layer is disposed on a bottom surface of the insulation layer and contacted with said at least one second conductive via. Said at least one electronic component is embedded within the insulation layer, and includes plural conducting terminals. The conducting terminal is electrically connected with the first conductive layer and the second conductive layer through said at least one first conductive via and said at least one second conductive via. The at least one thermal conduction structure is embedded within the insulation layer, and located at said at least one lateral side of said at least one electronic component. Said at least one thermal conduction structure is partially exposed outside the insulation layer, so that the heat generated by said at least one electronic component is transferred to the surroundings of the package structure through said at least one thermal conduction structure.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
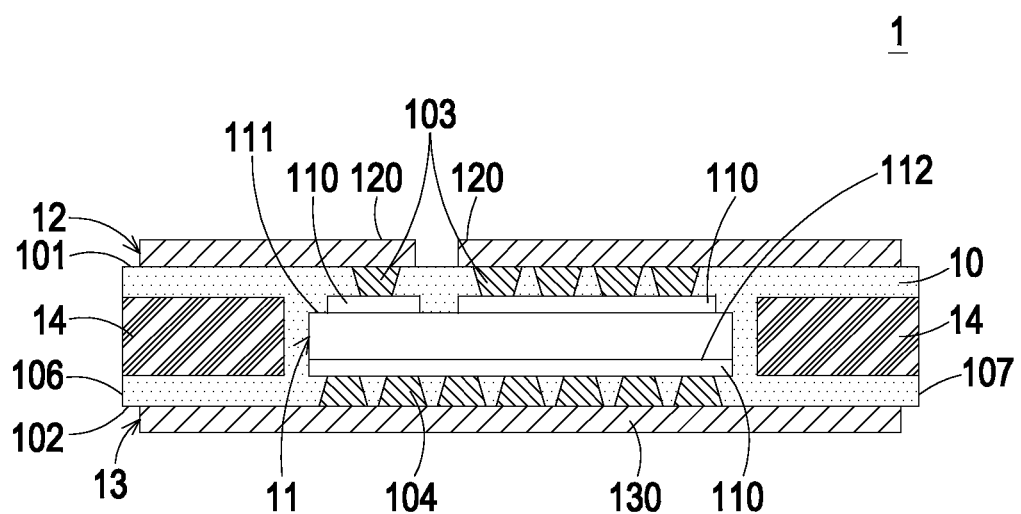
FIG. 1 is a schematic cross-sectional view illustrating a package structure according to a first embodiment of the present invention.

FIG. 1 is a schematic cross-sectional view illustrating a package structure according to a first embodiment of the present invention. The package structure 1 is a surface mount device (SMD) package structure. As shown in FIG. 1, the package structure 1 includes an insulation layer 10, an electronic component 11, a first conductive layer 12, a second conductive layer 13, and at least one thermal conduction structure 14. Moreover, several first conductive vias 103 and several second conductive vias 104 are formed in the insulation layer 10. The first conductive layer 12 is disposed on a top surface 101 of the insulation layer 10 and portion of the top surface 101 of the insulation layer 10 is exposed. The first conductive layer 12 is contacted with the first conductive vias 103. The second conductive layer 13 is disposed on a bottom surface 102 of the insulation layer 10 and portion of the bottom surface 102 of the insulation layer 10 is exposed. The second conductive layer 13 is contacted with the second conductive vias 104. The electronic component 11 is embedded within the insulation layer 10. Moreover, the electronic component 11 includes several conducting terminals 110. The conducting terminal 110 on a top surface 111 of the electronic component 11 is contacted with the corresponding first conductive vias 103. The conducting terminal 110 on a bottom surface 112 of the electronic component 11 is contacted with the corresponding second conductive vias 104. Consequently, the electronic component 11 is electrically connected with the first conductive layer 12 and the second conductive layer 13 through the conducting terminals 110, the first conductive vias 103 and the second conductive vias 104. The thermal conduction structure 14 is embedded within the insulation layer 10 and located at said at least one lateral side of the electronic component 11. Moreover, a part of the thermal conduction structure 14 is exposed outside the insulation layer 10. Consequently, the heat generated by the electronic component 11 may be transferred to the surroundings of the package structure 1 through the thermal conduction structure 14.

In an embodiment, for example, the insulation layer 10 is (but not limited to) made of resin or any other appropriate insulation material with high thermal conductivity. Moreover, the first conductive vias 103 are formed in the insulation layer 10, exposed to the top surface 101 of the insulation layer 10, and in contact with the first conductive layer 12. The second conductive vias 104 are formed in the insulation layer 10, exposed to the bottom surface 101 of the insulation layer 10, and in contact with the second conductive layer 13. The method of forming the first conductive vias 103 and the second conductive vias 104 are well known to those skilled in the art. For example, after the vias are formed in the insulation layer 10 by a laser drilling process, a mechanical drilling process or a photolithography process and a conductive material is formed in the vias by a filling process or an electroplating process, the first conductive vias 103 and the second conductive vias 104 are formed.

Moreover, by etching the first conductive layer 12 and the second conductive layer 13, one or more separate first conductive patterns 120 and one or more separate second conductive patterns 130 are formed. In this embodiment as shown in FIG. 1, the first conductive layer 12 includes two separate first conductive patterns 120, and the second conductive layer 13 includes one second conductive pattern 130. The first conductive patterns 120 are contacted with the corresponding first conductive vias 103, and the second conductive pattern 130 is contacted with the corresponding second conductive vias 104.

Moreover, the first conductive layer 12 and the second conductive layer 13 are made of copper or any other appropriate conductive material, but it is not limited thereto. For example, after the conductive material is electroplated or deposited on the top surface 101 and the bottom surface 102 of the insulation layer 10, the first conductive layer 12 and the second conductive layer 13 are formed. The first conductive patterns 120 and the second conductive pattern 130 may be served as contact pads of the package structure 1. Consequently, the package structure 1 may be mounted on a system circuit board (not shown) by a surface mount technology.

The electronic component 11 is an active component or a passive component. An example of the electronic component 11 includes but not limited to a chip, an integrated power component, a metal-oxide-semiconductor field-effect transistor (MOSFET), an insulated-gate bipolar transistor (IGBT), a diode, a capacitor, a resistor, an inductor or a fuse. The electronic component 11 is embedded within the insulation layer 10, and arranged between the first conductive vias 103 and the second conductive vias 104. The conducting terminal 110 on the top surface 111 of the electronic component 11 is electrically connected with the corresponding first conductive pattern 120 through the corresponding first conductive via 103. The conducting terminal 110 on the bottom surface 112 of the electronic component 11 is electrically connected with the corresponding second conductive pattern 130 through the corresponding second conductive via 104. Consequently, the first conductive patterns 120 and the second conductive pattern 130 are served as the contact pads of the package structure 1. After the package structure 1 is mounted on a system circuit board (not shown) by a surface mount technology, the conducting terminals 110 of the electronic component 11 are electrically connected with the electronic components (not shown) or traces (not shown) of the system circuit board through the first conductive patterns 120 and the second conductive pattern 130.

In this embodiment, the electronic component 11 is a metal-oxide-semiconductor field-effect transistor (MOSFET). That is, the electronic component 11 has three conducting terminals 110. As shown in FIG. 1, two of the conducting terminals 110 are formed on the top surface 111 of the electronic component 11, and one of the conducting terminals 110 is formed on the bottom surface 112 of the electronic component 11. The three conducting terminals 110 include a gate terminal, a source terminal and a drain terminal. That is, two of the gate terminal, the source terminal and the drain terminal are formed on the top surface 111 of the electronic component 11, and the other one of the gate terminal, the source terminal and the drain terminal is formed on the bottom surface 112 of the electronic component 11.

In this embodiment, two thermal conduction structures 14 are embedded within the insulation layer 10 and located at one side of the electronic component 11, respectively. In an embodiment as shown in FIG. 1, two thermal conduction structures 14 are (but not limited to) horizontally located at bilateral sides of the electronic component 11. Moreover, the two thermal conduction structures 14 are respectively exposed to a first side 106 and a second side 107 of the insulation layer 10, wherein the first side 106 and the second side 107 are opposed to each other. Consequently, the heat generated by the electronic component 11 may be transferred to the surroundings of the package structure 1 through the thermal conduction structures 14.

In some embodiments, the plural thermal conduction structures 14 are implemented by a single metallic lead frame, and the plural thermal conduction structures 14 are arranged around the electronic component 11. Consequently, the plural thermal conduction structures 14 made of metallic materials can not only be used to transfer heat from the electronic component 11 to the surroundings, but also be used to convey electricity. Moreover, at least one thermal conduction structure 14 can be disposed at the four sides of the electronic component 11. Therefore, the heat generated by the electronic component 11 can be transferred to the surroundings of the package structure 1 in horizontal direction. In addition, the plural thermal conduction structures 14 are not limited to be implemented by a single metallic lead frame. In some other embodiments, the plural thermal conduction structures 14 are implemented by a ceramic substrate with thermal conduction property. Alternatively, the plural thermal conduction structures 14 are implemented by other appropriate material or substrate with thermal conduction property.

Moreover, the plural thermal conduction structures 14 are separated from each other. That is, the plural thermal conduction structures 14 are not electrically connected with each other. Moreover, the thicknesses of the thermal conduction structures 14, the first conductive layer 12 and the second conductive layer 13 are not limited and can be determined according to the thickness of the electronic component 11 and the heat dissipating requirement of the package structure 1.

As mentioned above, the conducting terminals 110 of the electronic component 11 are electrically connected with the corresponding first conductive patterns 120 and the corresponding second conductive pattern 130 through the corresponding first conductive vias 103 and the corresponding second conductive vias 104. One or more thermal conduction and electrical conduction paths can be formed among the conducting terminals 110 of the electronic component 11, the corresponding first conductive vias 103 and/or the corresponding second conductive vias 104, and the corresponding first conductive patterns 120 and the corresponding second conductive pattern 130. Consequently, the heat generated by the electronic component 11 may be vertically transferred to the surroundings of the package structure 1 through the first conductive patterns 120 and the second conductive pattern 130. In addition, at least one thermal conduction structure 14 is disposed at at least one lateral side of the electronic component 11. In an embodiment as shown in FIG. 1, two thermal conduction structures 14 are horizontally located at bilateral sides of the electronic component 11. Consequently, the heat generated by the electronic component 11 may be horizontally transferred to the surroundings of the package structure 1 through the two thermal conduction structures 14 that are arranged at the first side 106 and the second side 107 of the insulation layer 10. Under this circumstance, the heat generated by the electronic component 11 can be transferred to the surroundings of the package structure 1 through the low thermal resistance paths along vertical and horizontal directions. Consequently, the heat dissipating efficacy of the package structure 1 is largely enhanced. Moreover, since the first conductive patterns 120 on the top surface 101 of the insulation layer 10 and the second conductive pattern 130 on the bottom surface 102 of the insulation layer 10 are served as the contact pads of the package structure 1, the first conductive layer 12 and the second conductive layer 13 may be used as the electrical conduction paths and thermal conduction paths at the top side and the bottom side of the electronic device 11. In other words, the package structure 1 has the functions of bilaterally conducting electricity and bilaterally dissipating heat.

Moreover, since the electronic component 11 is embedded within the insulation layer 10 and the conducting terminals 110 of the electronic component 11 are electrically connected with the corresponding first conductive patterns 120 and the corresponding second conductive pattern 130 through the corresponding first conductive vias 103 and the corresponding second conductive vias 104, it is not necessary to use the die attachment process to assemble the electronic component 11. Consequently, the fabricating cost of the package structure 1 is reduced and the use life of the package structure 1 is prolonged. Moreover, since the thermal conduction structures 14 are embedded within the insulation layer 10 and implemented by the metallic lead frame, the overall mechanical strength of the package structure 1 is increased, and the possibility of causing deformation of the package structure 1 is minimized.

It is noted that numerous modifications and alterations of the package structure 1 may be made while retaining the teachings of the invention. Hereinafter, some variant examples of the package structure 1 will be illustrated with reference to FIGS. 2-6. Component parts and elements corresponding to those of the first embodiment are designated by identical numeral references, and detailed descriptions thereof are omitted.

Figure 2A:
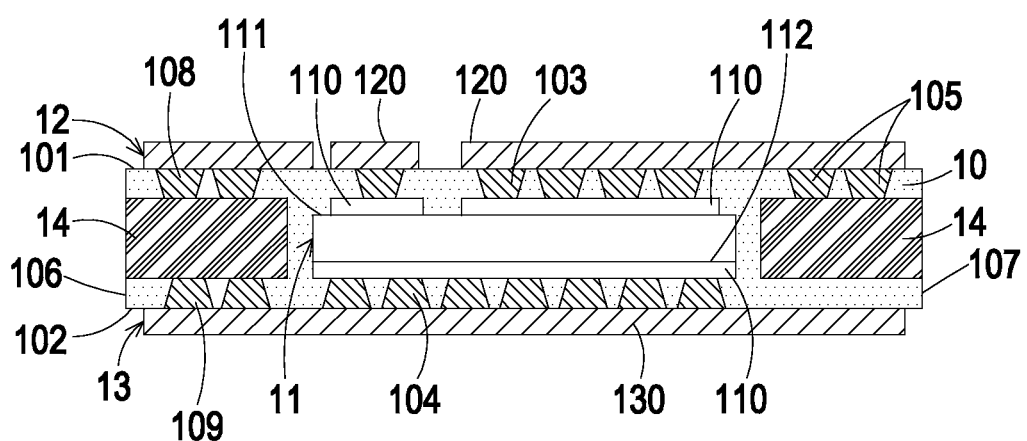
FIG. 2A is a schematic cross-sectional view illustrating a package structure according to a second embodiment of the present invention.
Figure 2B:
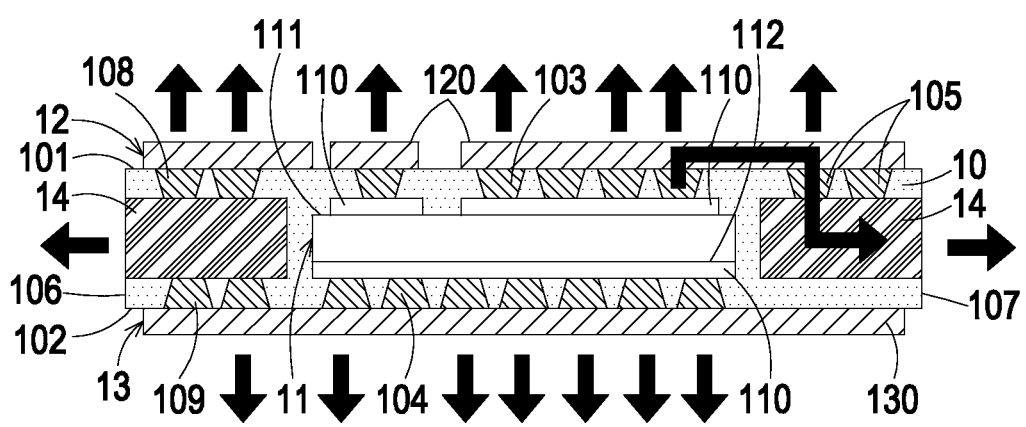
FIG. 2B shows the heat-dissipating directions of the package structure of FIG. 2A.
Figure 2C:
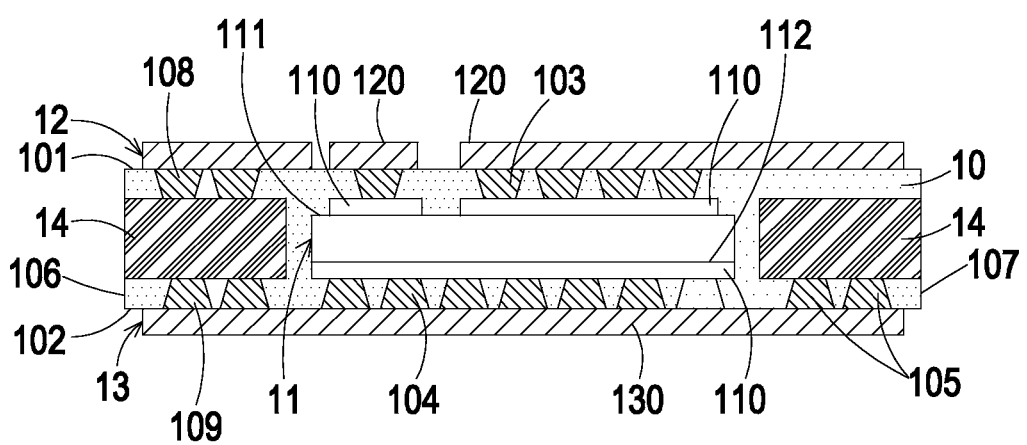
FIG. 2C is a schematic cross-sectional view illustrating a variant example of the package structure of FIG. 2A.

FIG. 2A is a schematic cross-sectional view illustrating a package structure according to a second embodiment of the present invention; and FIG. 2B shows the heat-dissipating directions of the package structure of FIG. 2A. In comparison with the first embodiment shown in FIG. 1, the package structure 2 of this embodiment further includes at least one third conductive via 105 formed in the insulation layer 10. A first end of the third conductive via 105 is in contact with the first conductive layer 12, and a second end of the third conductive via 105 is in contact with the corresponding thermal conduction structure 14. After the heat generated by the electronic component 11 is transferred to the first conductive layer 12, a portion of the heat may be transferred to the corresponding thermal conduction structure 14 through the third conductive via 105. The heat generated by the electronic component 11 can be transferred to the surroundings of the package structure 1 along the arrow directions as indicated in FIG. 2B. Consequently, the heat dissipating efficacy is further increased. Alternatively, in some other embodiments, as shown in FIG. 2C, the first end of the third conductive via 105 is in contact with the second conductive layer 13, and the second end of the third conductive via 105 is in contact with the corresponding thermal conduction structure 14. After the heat generated by the electronic component 11 is transferred to the second conductive layer 13, a portion of the heat may be transferred to the corresponding thermal conduction structure 14 through the third conductive via 105. Consequently, the heat dissipating efficacy is further increased. The method of forming the third conductive via 105 is similar to the method of forming the first conductive vias 103 and the second conductive vias 104, and is not redundantly described herein.

Similarly, the plural thermal conduction structures 14 are made of metallic material, and the plural thermal conduction structures 14 are separated from each other. That is, the plural thermal conduction structures 14 are not electrically connected with each other. In comparison with the first embodiment shown in FIG. 1, the package structure 2 of this embodiment further includes at least one fourth conductive via 108 and at least one fifth conductive via 109 formed in the insulation layer 10. A first end of the fourth conductive via 108 is connected with the corresponding first conductive pattern 120, and a second end of the fourth conductive via 108 is connected with the corresponding thermal conduction structure 14. A first end of the fifth conductive via 109 is connected with the corresponding second conductive pattern 130, and a second end of the fifth conductive via 109 is connected with the corresponding thermal conduction structure 14. The heat generated by the electronic component 11 may be vertically transferred to the surroundings of the package structure 2 through the thermal conduction path of the fourth conductive via 108, the fifth conductive via 109 and the thermal conduction structure 14. Consequently, the heat dissipating efficacy is further increased. Moreover, since the corresponding first conductive pattern 120 and the corresponding second conductive pattern 130 are electrically connected with each other, one side or two sides of the package structure 2 may be mounted on the system circuit board. In other words, the package structure 1 has the functions of bilaterally conducting electricity and quadrilaterally dissipating heat. The method of forming the fourth conductive via 108 and the fifth conductive via 109 are similar to the method of forming the first conductive via 103 and the second conductive via 104, and is not redundantly described herein.

Figure 3:
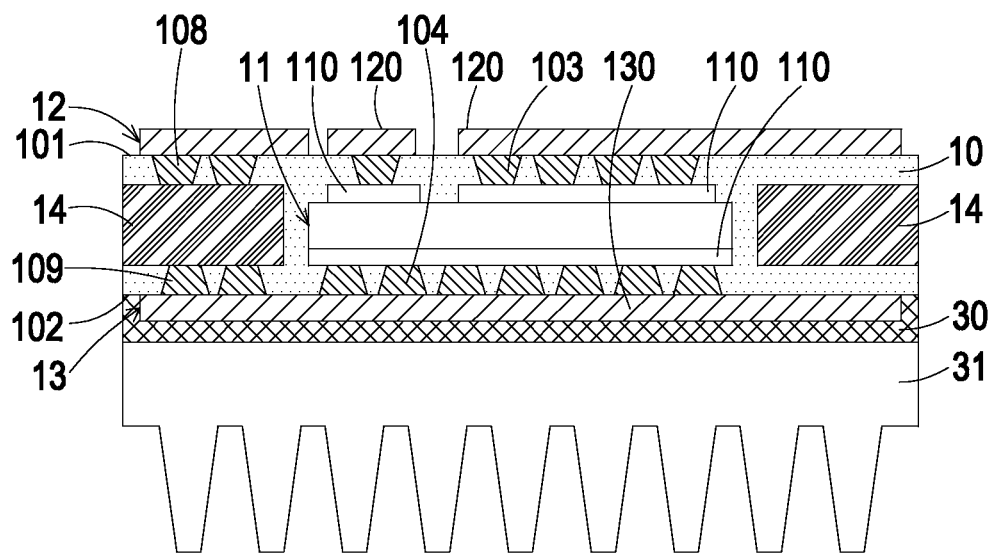
FIG. 3 is a schematic cross-sectional view illustrating a package structure according to a third embodiment of the present invention.

FIG. 3 is a schematic cross-sectional view illustrating a package structure according to a third embodiment of the present invention. In comparison with the first embodiment shown in FIG. 1, the package structure 3 of this embodiment further includes an insulating and heat-dissipating layer 30 and a heat dissipation device 31. The heat dissipation device 31 is located at an outer side of the second conductive layer 13 for enhancing the heat dissipating efficacy of the second conductive layer 13. The heat dissipation device 31 may be a passive heat dissipation device or an active heat dissipation device. An example of the passive heat dissipation device includes but not limited to a heat sink made of metallic material or ceramic material. An example of the active heat dissipation device includes but not limited to cooling water or heat pipe.

The insulating and heat-dissipating layer 30 is arranged between the heat dissipation device 31 and the second conductive layer 13. Namely, the insulating and heat-dissipating layer 30 is disposed on an outer surface of the second conductive layer 13, covering the second conductive layer 13 and in contact with the heat dissipation device 31. Due to the insulating and heat-dissipating layer 30, the conducting terminals 110 of the electronic component 11 and the second conductive layer 13 are isolated from the heat dissipation device 31. In addition, the heat generated by the heat electronic component 11 may be transferred to the heat dissipation device 31 through the insulating and heat-dissipating layer 30. More especially, since the package structure 3 can withstand a high voltage, the possibility of causing current leakage and high-voltage spark will be minimized.

Figure 4:
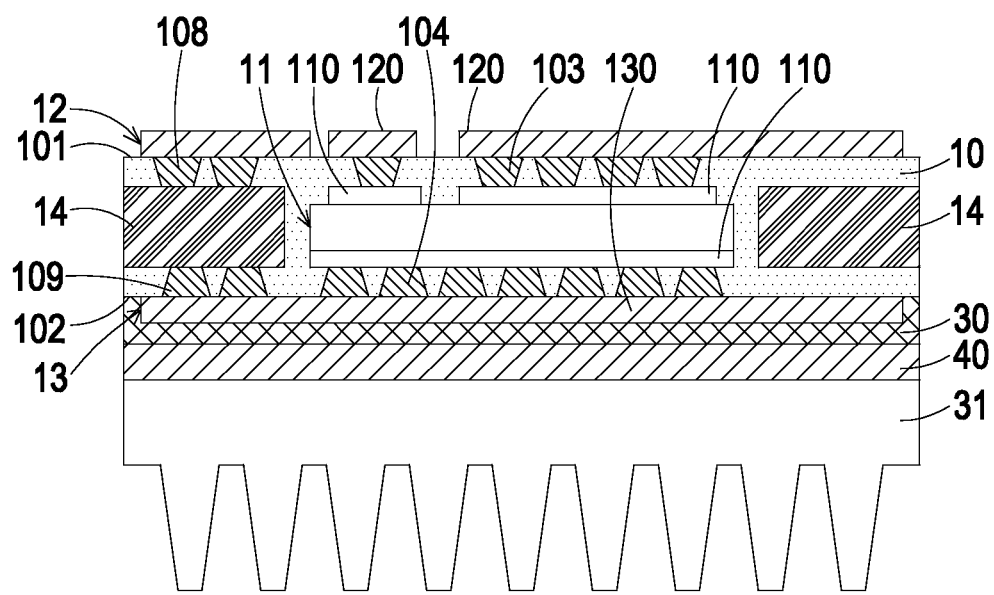
FIG. 4 is a schematic cross-sectional view illustrating a package structure according to a fourth embodiment of the present invention.

FIG. 4 is a schematic cross-sectional view illustrating a package structure according to a fourth embodiment of the present invention. In comparison with the third embodiment shown in FIG. 3, the package structure 4 of this embodiment further includes a metal layer 40. The metal layer 40 is arranged between the insulating and heat-dissipating layer 30 and the heat dissipation device 31. Namely, the metal layer 40 is disposed on an outer surface of the insulating and heat-dissipating layer 30 and in contact with the heat dissipation device 31. Due to the metal layer 40, the heat from the insulating and heat-dissipating layer 30 can be transferred to the heat dissipation device 31 more uniformly. Consequently, the heat dissipating efficacy is further increased.

Figure 5:
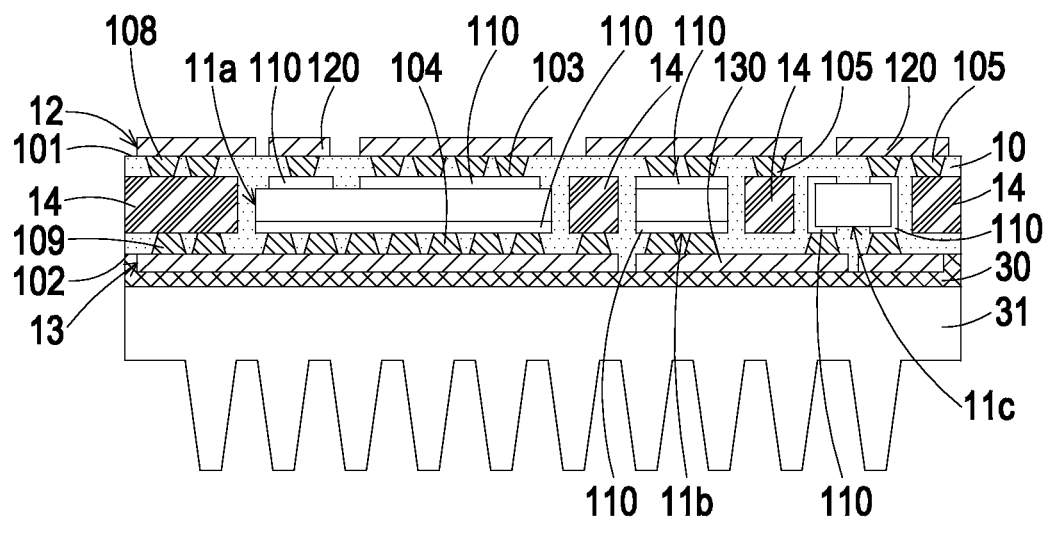
FIG. 5 is a schematic cross-sectional view illustrating a package structure according to a fifth embodiment of the present invention.

FIG. 5 is a schematic cross-sectional view illustrating a package structure according to a fifth embodiment of the present invention. In comparison with the third embodiment shown in FIG. 3, the package structure 5 of this embodiment includes plural electronic components 11, for example three electronic components 11a, 11b and 11c as shown in FIG. 5. The electronic components 11 can be same or different with each other. The number of conducting terminals 110 of each electronic component 11 is determined according to the type of the electronic component 11. If the electronic component 11 is a metal-oxide-semiconductor field-effect transistor (MOSFET), the electronic component 11 has three conducting terminals 110. For example, as shown in FIG. 5, the electronic component 11a is a metal-oxide-semiconductor field-effect transistor (MOSFET) with three conducting terminals 110. Moreover, if the electronic component 11 is a capacitor, a resistor or a diode, the electronic component 11 has two conducting terminals 110. For example, as shown in FIG. 5, the electronic component 11b is a diode and the electronic component 11c is a capacitor or a resistor. It is noted that the electronic components 11 disposed in the package structure 5 are not limited to the types shown in FIG. 5 and can be varied according to the practical requirements.

In this embodiment, every two thermal conduction structures 14 are horizontally located at bilateral sides of every electronic component 11. That is, one electronic component 11 is arranged at every two adjacent thermal conduction structures 14.

Figure 6:
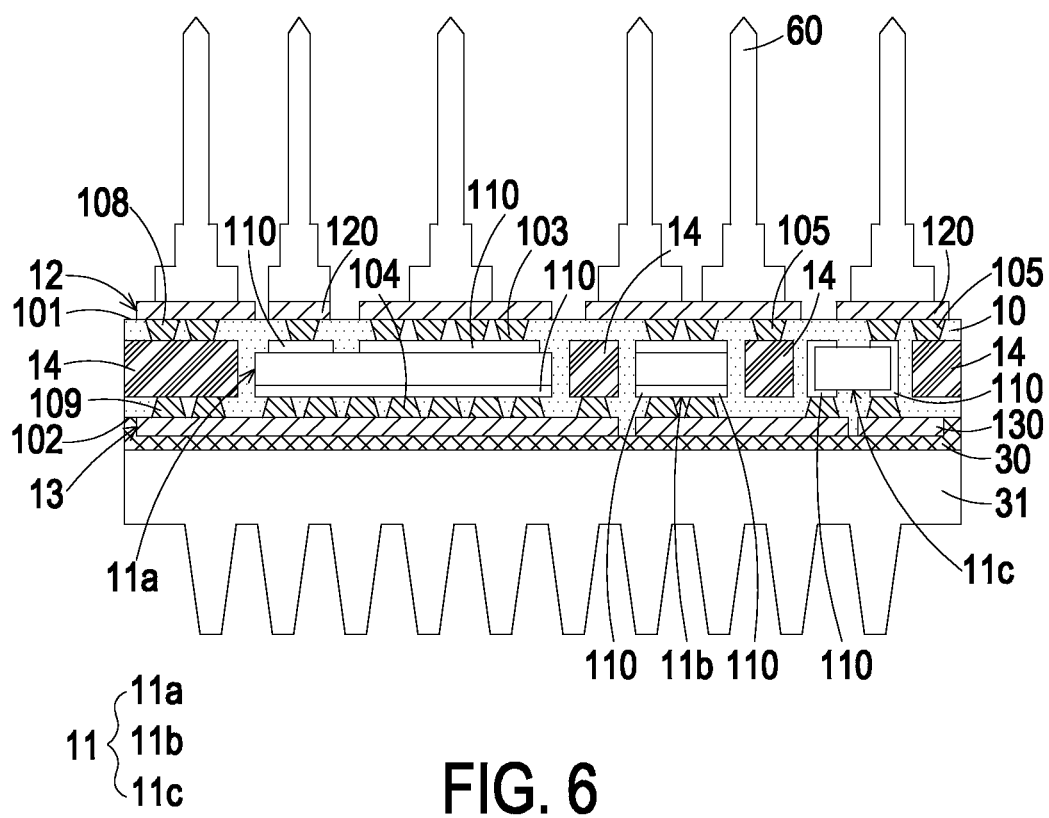
FIG. 6 is a schematic cross-sectional view illustrating a package structure according to a sixth embodiment of the present invention.

FIG. 6 is a schematic cross-sectional view illustrating a package structure according to a sixth embodiment of the present invention. In comparison with the fifth embodiment shown in FIG. 5, the package structure 6 of this embodiment further includes at least one pin 60. Said at least one pin 60 is disposed on and connected with the corresponding first conductive pattern 120 of the first conductive layer 12. Said at least one pin 60 is connected with the corresponding first conductive pattern 120 by, for example, a solder paste soldering process, a ultrasonic welding process, a hot pressure welding process, an electric welding process or a mechanical embedding process, but it is not limited thereto. The package structure 6 can be fixed and connected with a system circuit board by inserting the pin 60 into the system circuit board and welding the pin 60 on the system circuit board.

From the above descriptions, the present invention provides a package structure. The package structure includes an insulation layer, a first conductive layer, a second conductive layer, at least one electronic component, and at least one thermal conduction structure. The electronic component is embedded within the insulation layer. The first conductive layer and the second conductive layer are formed on a top surface and a bottom surface of the insulation layer, respectively. The plural conducting terminals of the electronic component are electrically connected with the first conductive layer and the second conductive layer through conductive vias. Said at least one thermal conduction structure is partially embedded within the insulation layer, and located at said at least one lateral side of the electronic component, for example horizontally located at bilateral sides of the electronic component. Consequently, the heat generated by the electronic component can be transferred to the surroundings of the package structure through the low thermal resistance paths of the conductive layers and the thermal conduction structures along vertical and horizontal directions. In comparison with the conventional technology, the heat dissipating efficacy of the package structure of the present invention is largely enhanced. Moreover, since the first conductive layer and the second conductive layer are respectively formed on the top surface and the bottom surface of the insulation layer, the package structure has the functions of bilaterally conducting electricity and multilaterally dissipating heat. Moreover, since the electronic component is directly embedded within the insulation layer and the conducting terminals of the electronic component are electrically connected with the corresponding conductive patterns through corresponding conductive vias, the fabricating cost of the package structure is reduced and the use life of the package structure is prolonged. Moreover, since the thermal conduction structures are embedded within the insulation layer and implemented by the metallic lead frame, the overall mechanical strength of the package structure is increased, and the possibility of causing deformation of the package structure is minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure comprising:
    an insulation layer having a top surface, a bottom surface, and an outer surface;
    a first electronic component embedded within the insulation layer, wherein the first electronic component comprises a first conducting terminal and a second conducting terminal;
    a first conductive layer formed on the top surface of the insulation layer;
    a second conductive layer formed on the bottom surface of the insulation layer;
    at least one first conductive via electrically coupling the first conductive layer to the first conducting terminal;
    at least one second conductive via electrically coupling the second conductive layer to the second conducting terminal; and
    a thermal conduction structure embedded within the insulation layer and having a top surface, a bottom surface, an outer surface, and an inner surface, wherein the top surface of the thermal conduction structure is separated from the first conductive layer by the insulation layer, the bottom surface of the thermal conduction structure is separated from the second conductive layer by the insulation layer, the inner surface of the thermal conduction structure is separated from the first electronic component by the insulation layer, and the outer surface of the thermal conduction structure is exposed within the outer surface of the insulation layer thereby facilitating heat dissipation out through the exposed outer surface of the thermal conduction structure.

2. The package structure of claim 1, wherein the thermal conduction structure surrounds the first electronic component.

3. The package structure of claim 1, further comprising one or more additional electronic components embedded within the insulation layer.

4. The package structure of claim 1, wherein the first electronic component further comprises one or more additional conducting terminals, further comprising:
    one or more additional conductive layers corresponding to the one or more additional conducting terminals of the first electronic component; and
    one or more additional conductive vias electrically coupling the additional conductive terminals to the corresponding conductive layers.

5. The package structure of claim 4, wherein the first electronic component is a metal-oxide-semiconductor field-effect transistor (MOSFET) or an insulated-gate bipolar transistor (IGBT).

6. The package structure of claim 1, further comprising one or more third conductive vias electrically coupling at least one of the at least one first conductive layer and the at least one second conductive layer to the thermal conduction structure.

7. The package structure of claim 1, wherein the first electronic component is a diode, a capacitor, a resistor, an inductor, or a fuse.

8. The package structure of claim 1, wherein the first conductive layer comprises a first conductive pattern, and the second conductive layer comprises a second conductive pattern.

9. The package structure of claim 1, further comprising:
    at least one additional thermal conduction structure embedded within the insulation layer, wherein each additional thermal conduction structure having an outer surface exposed within the outer surface of the insulation layer thereby facilitating heat dissipation out through the exposed outer surface of the additional thermal conduction structure.

10. The package structure of claim 9, wherein the at least one additional thermal conduction structure is positioned opposite the thermal conduction structure.

11. The package structure of claim 1, further comprising:
    at least one pin disposed on and connected with at least one of the at least one first conductive layer and the at least one second conductive layer.

12. The package structure of claim 1, further comprising:
    a second electronic component embedded within the insulation layer; and
    a second thermal conduction structure embedded within the insulation layer between the first and second electronic components.

13. The package structure of claim 12, wherein the second thermal conduction structure is a portion of the first thermal conduction structure.

14. The package structure of claim 1, further comprising:
    a heat dissipation device disposed on an outer surface of the second conductive layer.

15. The package structure of claim 14, wherein the heat dissipation device is an active heat dissipation device of a passive heat dissipation device.

16. The package structure of claim 14, further comprising:
an insulating and heat-dissipating layer arranged between the heat dissipation device and the second conductive layer.

17. The package structure of claim 16, further comprising:
a metal layer arranged between the insulating and heat-dissipating layer and the heat dissipation device.

18. The package structure of claim 1, wherein the first electronic component is a chip or an integrated power component.

19. The package structure of claim 1, wherein the thermal conduction structure is implemented by a lead frame.

20. A package structure comprising:
an insulation layer having a first surface, a second surface opposite the first surface, and an outer surface;
a first electronic component embedded within the insulation layer, wherein the first electronic component comprises a first conducting terminal, a second conducting terminal, and a third conducting terminal;
a first conductive layer formed on the first surface of the insulation layer;
a second conductive layer formed on the first surface of the insulation layer;
a third conductive layer formed on the second surface of the insulation layer;
one or more first conductive vias electrically coupling the first conductive layer to the first conducting terminal;
one or more second conductive vias electrically coupling the second conductive layer to the second conducting terminal;
one or more third conductive vias electrically coupling the third conductive layer to the third conducting terminal; and
a thermal conduction structure embedded within the insulation layer and having a first surface, a second surface opposite the first surface, an outer surface, and an inner surface, wherein the first surface of the thermal conduction structure is separated from the first and second conductive layers by the insulation layer, the second surface of the thermal conduction structure is separated from the third conductive layer by the insulation layer, the inner surface of the thermal conduction structure is separated from the first electronic component by the insulation layer, and the outer surface of the thermal conduction structure is exposed within the outer surface of the insulation layer thereby facilitating heat dissipation out through the exposed outer surface of the thermal conduction structure.

* * * * *